(12) United States Patent
Derner et al.

(10) Patent No.: US 6,650,587 B2
(45) Date of Patent: Nov. 18, 2003

(54) PARTIAL ARRAY SELF-REFRESH

(75) Inventors: Scott J. Derner, Meridian, ID (US); Casey R. Kurth, Boise, ID (US); Daryl L. Habersetzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/988,988

(22) Filed: Nov. 19, 2001

(65) Prior Publication Data

US 2003/0095459 A1 May 22, 2003

(51) Int. Cl.⁷ ................................................. G11C 7/00
(52) U.S. Cl. ........................................ 365/222; 365/236
(58) Field of Search ................................ 365/222, 236

(56) References Cited

U.S. PATENT DOCUMENTS 6,215,714 B1 * 4/2001 Takemae et al. ............ 365/222
6,349,068 B2 * 2/2002 Takemae et al. ............ 365/222

OTHER PUBLICATIONS

Betty Prince, "Semiconductor Memories", 1983, Wiley, 2$^{nd}$ edition, pp. 220–221.*

* cited by examiner

Primary Examiner—M. Tran
(74) Attorney, Agent, or Firm—Schwegman, Lundberg, Woesner & Kluth, P.A.

(57) ABSTRACT

A memory device includes an address selection circuit to store addresses of selected rows of memory cells. During a refresh mode, only the memory cells of the selected rows are refreshed. The addresses of the selected rows can be stored by a user or automatically.

49 Claims, 10 Drawing Sheets

FIG. 7

| RANGE | ROWS |
|---|---|
| 0 | 0–511 |
| 1 | 512–1023 |
| 2 | 1024–1535 |
| 3 | 1536–2047 |

FIG. 8

| ROW ADDRESS BITS | ROWS |
|---|---|
| 00XXXXXXXXX | 0–511 |
| 01XXXXXXXXX | 512–1023 |
| 10XXXXXXXXX | 1024–1535 |
| 11XXXXXXXXX | 1536–2047 |

A10, A9, A8–A0

PARTIAL ARRAY SELF-REFRESH

TECHNICAL FIELD OF THE INVENTION

The present invention relates to integrated circuits and in particular to a refresh operation in a memory device.

KACKGROUND OF THE INVENTION

Memory devices such as dynamic random access memory (DRAM) devices are widely used to store data in computers and electronic products.

A typical DRAM device has many memory cells. Each memory cell is capable of storing a bit of data. The value of the data in each memory cell is determined by the value of a charge held by the memory cell. As a known electrical property, charge loses its value over time due to leakage and other factors, causing data to become invalid. Therefore, to retain the validity of the data, the memory cells are periodically refreshed to keep the charges at their original values.

In a typical DRAM device, the memory cells are refreshed during a refresh mode, in which all memory cells are refreshed regardless of whether all or only a portion of the memory cells contain useful data. Therefore, refreshing all memory cells during the refresh mode is not efficient.

For these and other reasons stated below, and which will become apparent to those skilled in the art upon reading and understanding the present specification, there is a need for an efficient method to refresh memory cells in a memory device.

SUMMARY OF THE INVENTION

The present invention includes a memory device having a refresh address selection circuit to store a number of selected rows of memory cells such that during a refresh mode only the memory cells of the selected rows are refreshed.

In one aspect, the memory device includes a counter to count addresses of rows of memory cells, a register to store selected addresses of rows of memory cells, and a compare circuit connected to the counter and the register to compare an address counted by the counter with the selected address such that a row of memory cells located at the address counted by the counter is refreshed if the address counted by the counter is within the selected addresses.

In another aspect, a method of refreshing memory cells of the memory device includes generating a count that represents an address of a row of the memory cells. The address represented by the count is compared with a selected address. Memory cells located at the address represented by the count are refreshed if the address represented by the count matches the selected address.

BRIEF DESCRIPTION OF THE DRAWINGS

FIG. 7 shows a number of address ranges.

FIG. 8 shows combinations of bits that represent the number of row addresses of the address ranges of FIG. 7.

DETAILED DESCRIPTION OF THE INVENTION

Figure 1:
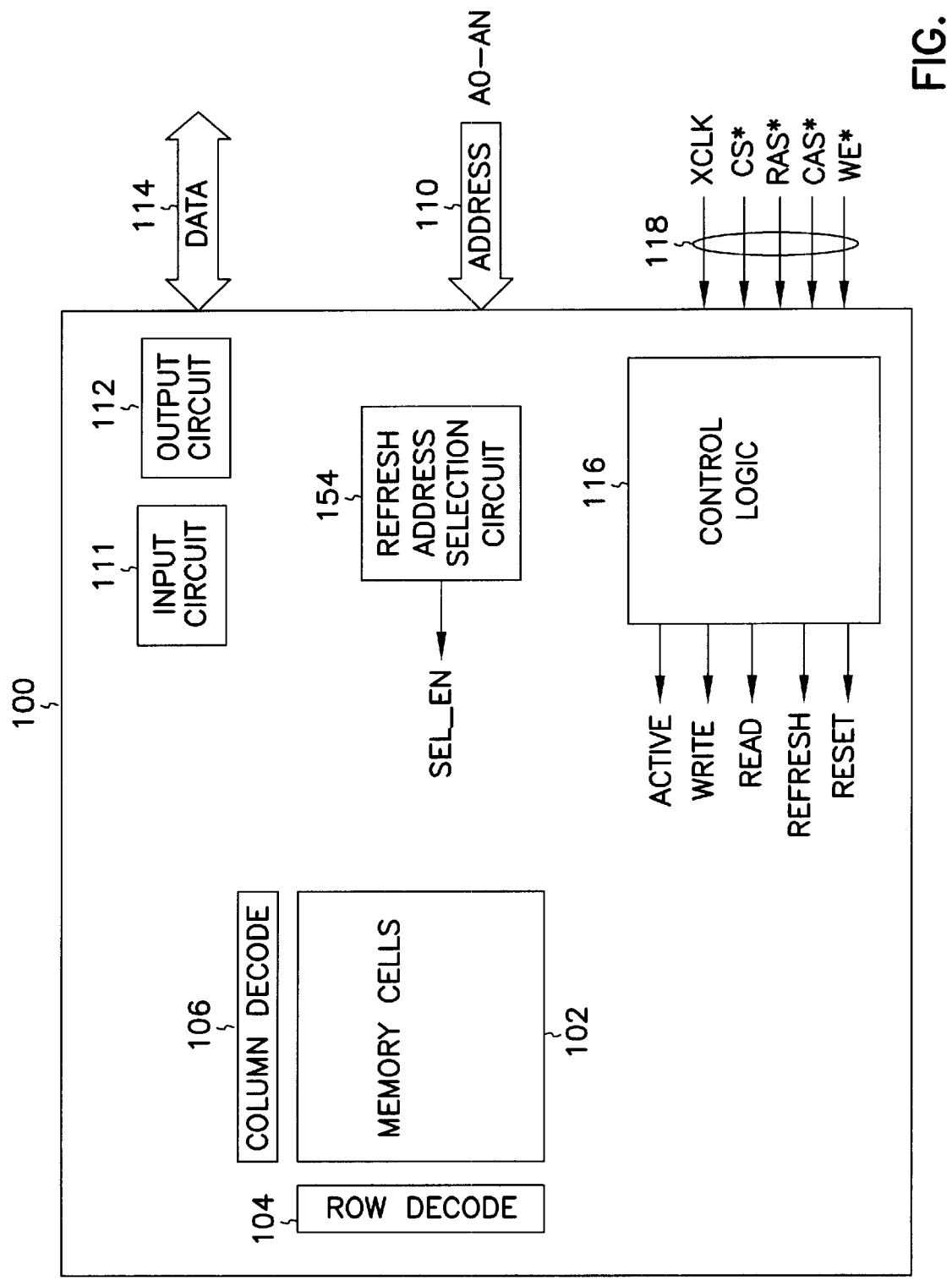
FIG. 1 is a block diagram of a memory device.

In the following detailed description of the embodiments, reference is made to the accompanying drawings that show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, the various embodiments of the invention, although different, are not necessarily mutually exclusive. For example, a particular feature, structure, or characteristic described in one embodiment may be included within other embodiments. Therefore, the following detailed description is not to be taken in a limiting sense, and the scope of the present invention is defined only by the appended claims, along with the full scope of equivalents to which such claims are entitled.

FIG. 1 is a block diagram of a memory device 100 according to one embodiment of the invention. Memory device 100 includes a main memory 102. Main memory 102 includes a plurality of memory cells arranged in rows and columns. Row decode 104 and column decode 106 access individual memory cells in the rows and columns in response to address signals A0–AN (ADDRESS), provided on address bus or address lines 110. An input circuit 111 and an output circuit 112 connect to a data bus 114 (DATA) for bi-directional data communication with main memory 102. A control logic 116 generates a number of command signals, such as WRITE, READ, ACTIVE, REFRESH, and RESET signals in response to control signals provided on control lines 118. The control signals include, but are not limited to, an external clock signal XCLK, a Chip Select signal CS*, a Row Access Strobe signal RAS*, a Column Access Strobe CAS* signal, and a Write Enable signal WE*.

Memory device 100 further includes a refresh address selection circuit 154. During a refresh mode, refresh address selection circuit 154 provides refresh address select signal SEL_EN to control logic 116. Based on the state of the SEL_EN signal, control logic 116 causes memory device 100 to refresh only selected rows of memory cells. The addresses of the selected rows are stored in refresh address selection circuit 154.

Memory device 100 describes a general embodiment of a memory device and is not a complete description of all the elements and features of a DRAM. Further, the invention is equally applicable to any size and type of memory circuit and is not limited to the DRAM described above. Additionally, the DRAM could be a synchronous DRAM commonly referred to as SGRAM (Synchronous Graphics Random Access Memory), SDRAM (Synchronous Dynamic Random Access Memory), SDRAM II, DDR SDRAM (Double Data Rate SDRAM), and Synchlink or Rambus DRAMs.

The modes of operation of memory device 100 such as write, read, and active modes are similar to that of conventional DRAM devices as known to those skilled in the art. Therefore, detailed operation of these modes are not described here. In a write mode, control logic 116 initiates the WRITE signal at the start of the write mode when certain combination of the CS*, RAS*, CAS*, and WE* signals received at input 118 is decoded by control logic 116 as valid for the write mode. Data from data lines 114 is written to memory cells in the rows and columns of main memory 102. The address of the row of memory cells being written is provided by a combination of the address signals A0–AN on lines 110.

In a read mode, control logic 116 initiates the READ signal at the start of the read mode when a certain combination of the CS*, RAS*, CAS*, and WE* signals received at input 118 is decoded by control logic 116 as valid for the read mode. Data is read from memory cells in the rows and columns of main memory 102. The data is subsequently output to data lines 114. The address of the row of memory cells being written is provided by a combination of the address signals A0–AN on lines 110.

Before the data is written into the memory cells, or before the data is read from the memory cells, an active mode is performed. Control logic 116 activates the ACTIVE signal in the active mode at the start of the active mode when a certain combination of the CS*, RAS*, CAS*, and WE* signals is decoded by control logic 116 as valid for the active mode. During the active mode, a selected row of memory cells is activated to prepare for the read or write mode. A combination of the address signals A0–AN, which represents the address of the selected row, is decoded by row decoder 104 to activate one of the rows in main memory 102. For example, if main memory 102 has 2,048 rows and the combination of the A0–AN signals is 00000000001 (representing the address of row 1), then row 1 is activated. If a write mode follows the active mode, the activated row is accessed and data is written into the memory cells of row 1. If a read mode follows the active mode, the activated row is accessed and data is read from the memory cells of row 1.

Further, the addresses of the rows that are activated and accessed during the write or read mode are stored in address selection circuit 154. Because the rows that are accessed contain useful data, these rows are refreshed during the refresh mode to retain the validity of the data. The non-accessed rows, which do not contain useful data, are not refreshed during the refresh mode to save time and power.

In the refresh mode, control logic 116 activates the REFRESH signal based on certain valid combination of CS*, RAS*, CAS*, and WE* signals to refresh the memory cells of main memory 102. For example, the refresh mode is performed when a combination of the CS*, RAS*, CAS*, and WE* signals is LOW, LOW, LOW, and HIGH. During the refresh mode, refresh address selection circuit 154, in response to the REFRESH signal, activates the SEL_EN signal. The SEL_EN signal is provided to control logic 116. Based on the state of the SEL_EN signal, control logic 116 determines which of the rows in main memory 102 is refreshed during the refresh operation.

Throughout the description, a refresh mode is referred to as a self-refresh mode. However, the embodiments described in the specification can also use other types of refresh modes known to those skilled in the art, e.g., auto-refresh.

Figure 2:
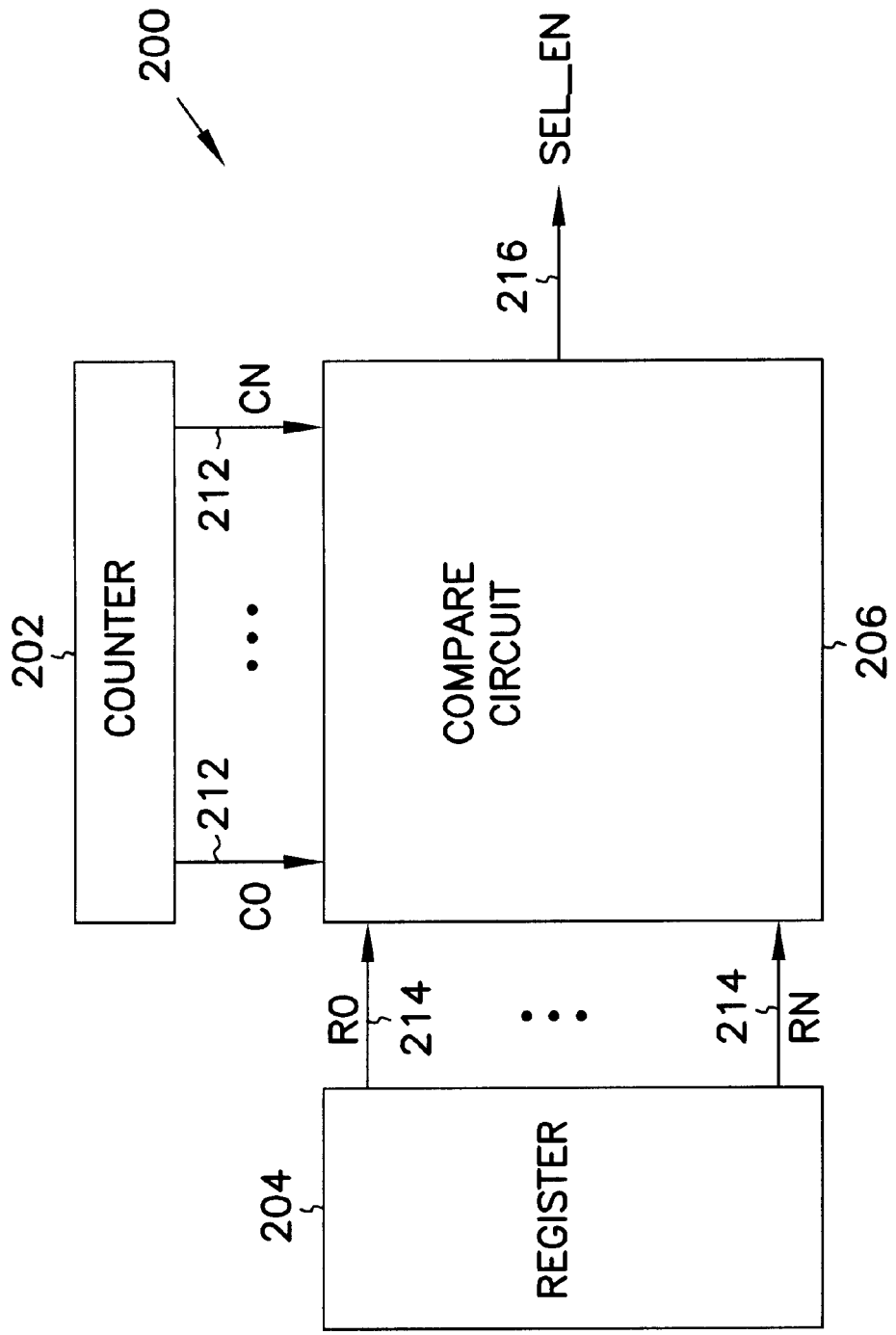
FIG. 2 is a block diagram of a refresh address selection circuit of FIG. 1.

FIG. 2 is a block diagram of a refresh address selection circuit 200 according to one embodiment of the invention. Refresh address selection circuit 200 includes an address counter 202, a register 204, and a compare circuit 206. Counter 202 includes multiple counter bit lines 212 to provide counter output signals C0–CN. Each combination of the C0–CN signals represents an address of a row of memory cells. Register 204 includes multiple register bit lines 214 to provide register output signals R0–RN. In one embodiment, a combination of the R0–RN signals represents selected addresses of rows of memory cells. In other embodiments, a state of each of the R0–RN signals represents a corresponding selected range of addresses of rows of memory cells. Compare circuit 206 connects to counter 202 and register 204 via lines 212 and 214 to receive the C0–CN and R0–RN signals. Compare circuit 206 compares the C0–CN and the R0–RN signals to provide a refresh select signal SEL_EN on line 216. FIG. 1 also shows the SEL_EN signal.

During a refresh mode, counter 202 counts row addresses of memory cells in a sequential order. Each of the row address counted by counter 202 is compared with the selected row addresses stored in register 204. Based on the comparison, compare circuit 206 activates the SEL_EN signal accordingly. The SEL_EN signal is provided to a control logic, such as control logic 116 of FIG. 1. Based on the state of the SEL_EN signal, control logic 116 determines whether or not to refresh the memory cells located at the counted row addresses.

For example, when a row address counted by counter 202 is within or matches the selected row addresses stored in register 204, compare circuit 206 asserts a LOW to the SEL_EN signal to refresh the memory cells located at the counted row address. When a row address counted by counter 202 is not within or does not match the selected row addresses stored in register 204, compare circuit 206 asserts a HIGH to the SEL_EN signal to prevent a refresh of the memory cells located at the counted row address.

Figure 3:
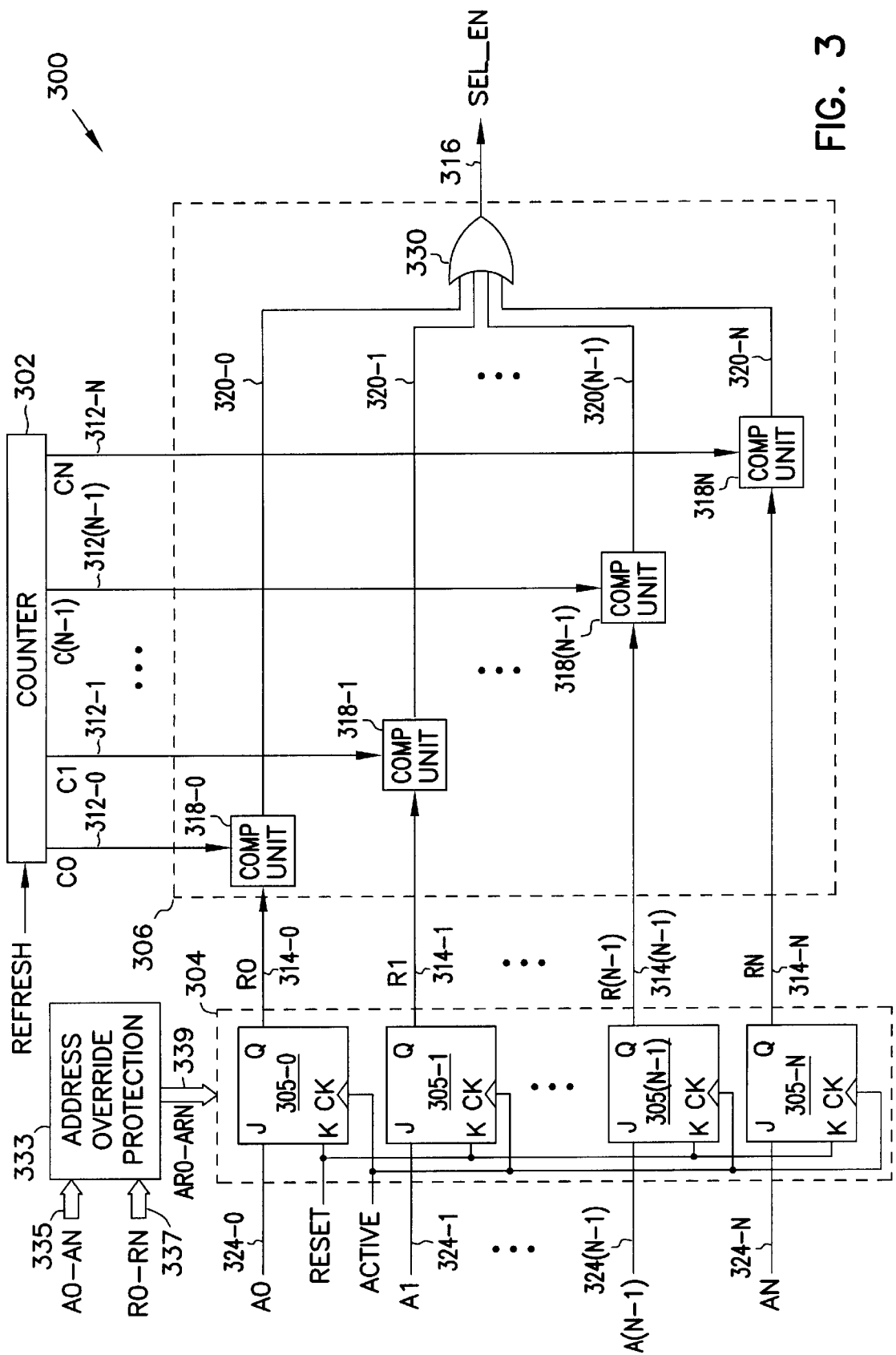
FIG. 3 is a schematic diagram of the refresh address selection of FIG. 2.

FIG. 3 is a schematic diagram of a refresh address selection circuit 300 according to one embodiment of the invention. Circuit 300 includes an address counter 302, a register 304, and a compare circuit 306. Elements 302, 304 and 306 represent counter 202, register 204 and compare circuit 206 of FIG. 2. In FIG. 3, counter 302 provides the output signals C0–CN on counter bit lines 312-0 to 312-N. Each combination of the signals C0–CN represents an address of a row of memory cells. Register 304 includes a plurality of storage elements 305-0 to 305-N connected to a plurality of register bit lines 314-0 to 314-N. In the embodiment represented by FIG. 3, storage elements 305-0 to 305-N are represented by JK flip flops 305-0 to 305-5. Each of the flip-flops 305-0 to 305-N includes a first data input indicated by J, a second data input indicated by K, a clock input indicated by CK, and an output indicated by Q. Each flip flop is capable of storing a bit of data.

In each of the flip flops 305-0 to 305-N, the first data input J connects to one of the address lines 324-0 to 324-N to receive one of the address signals A0–AN. The second data input K receives a reset signal RESET. The clock input CK receives a command signal ACTIVE. Each output Q provides an output signal on one of the register bit lines 314-0 to 314-N. For example, flip flop 305-0 connects to line 324-0 to receive address signal A0, flip flop 305-1 connects to line 324-1 to receive address signal A1, and flip flop 305-N connects to line 324-N to receive address signal AN. Lines 305-0 to 305-N are part of an address bus such as address bus 110 in FIG. 1. The ACTIVE signal in FIG. 3 is also shown as the ACTIVE signal generated by control logic 116 of FIG. 1.

Compare circuit 306 includes a plurality of compare units (COMP UNIT) 318-0 to 318-N. Each includes a first input connected to one of the counter bit lines 312-0 to 312-N to receive one of the counter output signals C0–CN, and a second input connected to one of the register bit lines 305-0 to 305-N to receive one of the register output signals R0–RN. Each of the compare units 318-0 to 318-N also includes an output connected to one of a plurality of compare unit output lines 320-0 to 320-N. Output lines 320-0 to 320-N connect to a combinatorial circuit 330. In the embodiment represented by FIG. 3, combinatorial circuit 330 is an OR gate 330. OR gate 330 has an output connect to line 316, which provides a refresh select signal SEL_EN. The SEL_EN signal is also shown in FIG. 2.

Refresh address selection circuit 300 further includes an address override protection circuit 333. Address override protection circuit 333 includes inputs connected to lines 335 and 337 to receive the A0–AN and R0–RN signals and outputs connected to lines 339 to provide multiple signals AR0–ARN.

Figure 4:
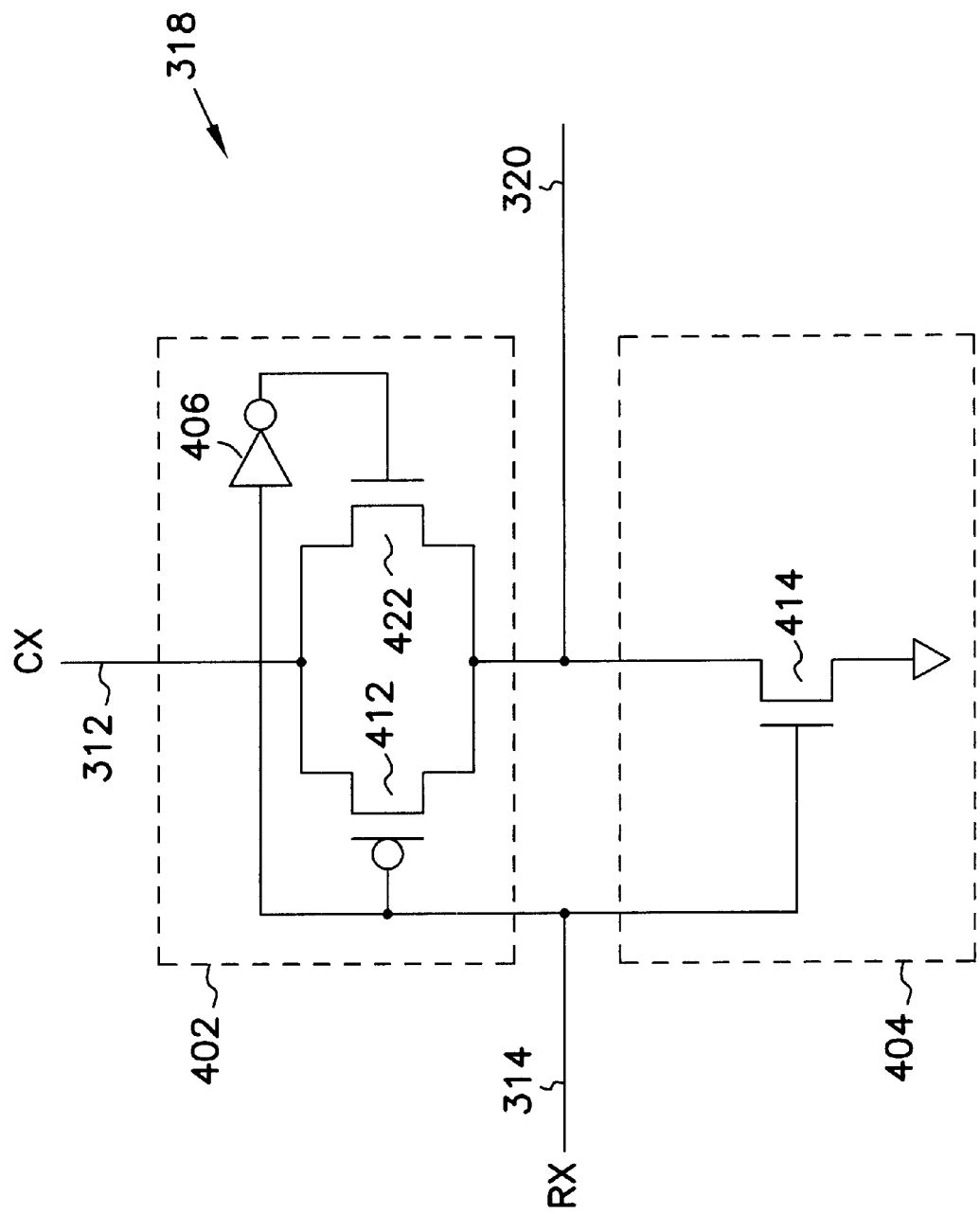
FIG. 4 is a schematic diagram of a compare unit of FIG. 3.

FIG. 4 is a schematic diagram of a compare unit 318. Compare unit 318 represents one of the compare units 318-0 to 318-N of FIG. 3. Compare unit 318 includes a pullup 402 and a pulldown 404. Pullup 402 includes a p-channel transistor 412, an n-channel transistor 422 and an inverter 406. Transistors 412 and 422 and inverter 406 connect together to operate as a pass gate to pass a signal from line 312 to line 320. The gate of transistor 412 connects to line 314 to receive one of the register output signals R0–RN indicated by RX. The gate of transistor 422 connects to line 314 through inverter 406 to receive an inverse of one of the RX signal. Pulldown 404 includes an n-channel transistor 414. Transistor 414 has a source and a drain connected between output 320 and ground, and a gate connected to line 314 to receive the RX signal. In the embodiment represented by FIG. 4, line 320 represents one of the lines 320-0 to 320-N (FIG. 3), line 312 represents line 212 (FIG. 2) and one of the lines 312-0 to 312-N (FIG. 3), and line 314 represents line 214 (FIG. 2) and one of the lines 314-0 to 314-N (FIG. 3). Further, the CX signal represents one of the C0–CN signals, and the RX signal represents one of the R0–RN signals (FIG. 3).

Referring to FIG. 3, during a refresh operation, counter 302 sequentially counts row addresses from row zero to the last row of the memory cells in response to the REFRESH signal. For example, in a memory device having 2048 rows of memory cells, counter 302 sequentially counts from row zero to row 2047. Each counted row address is represented by a unique combination of the C0–CN signals presented on line 312-0 to 312-N. Thus, to cover 2048 counts, counter 302 includes eleven counter bits lines to provide eleven corresponding counter output signals, i.e., counter bit lines 312-0 to 312-10 and eleven corresponding counter output signals C0–C10, where 312-10 is represented by 312-N and C10 is represented by CN. In the example, count zero is represented by a combination of 00000000000 (eleven logic 0 bits), i.e., C0=0, C1=0 and all other counter bits from C2 through CN are all zeros. In terms of signal level, the signal level is LOW on each of the counter bit lines 312-0 to 312-N (N=10). In a similar pattern, count 1 is represented by 0000000001, i.e., C0=1 (HIGH), C1=0 (LOW), and count 2047 is represented by 11111111111 (all C0–CN are HIGH). In FIG. 3, the REFRESH signal is provided by a control logic such as control logic 116 shown in FIG. 1.

Compare circuit 306 compares each combination of the signals on lines 312-0 to 312-N with the combination of the signals on line 314-0 to 314-N. If the counted row address on lines 312-0 to 312-N matches the selected row addresses on lines 314-0 to 314-N, compare circuit 306 asserts a LOW on the SEL_EN signal. If the counted row address does not match the selected row addresses, compare circuit 306 asserts a HIGH to the SEL_EN. The SEL_EN signal is provided to a control logic such as control logic 116 (FIG. 1). Based on the state of the SEL_EN signal, the control logic either allows or prevents the refresh of the memory cells located at the counted row address. In the embodiment, refresh selection circuit 300 causes the control logic to refresh memory cells at a counted row address counted when the SEL_EN signal is LOW. Refresh circuit 300 causes the control logic to prevent a refresh of memory cells at a counted row address counted when the SEL_EN signal is HIGH. In other embodiments, other signal levels of the SEL_EN signal could be used.

The selected row addresses are stored in register 304 by either an automatic address detection method or a user program method. In the automatic detection method, flip flops 305-0 to 305-N automatically store the row addresses of the rows that are activated during the active mode. In the user program method, the user enters the selected row address into register 304 by applying appropriate programming signals to input lines of memory device 100 such as lines 110 and 118 of FIG. 1.

In the automatic address detection method, flip flops 305-0 to 305-N are first reset by activating the RESET signal and applying a LOW to all A0–AN signals so that flip flops 305-0 to 305-N store a logic 0 bit and that the R0–RN signals are LOW. After the flip flops are reset, the RESET signal is deactivated (LOW). After the RESET signal is deactivated, the signal levels of the R0–RN signals depend on changes on the signal levels of the A0–AN signals. The A0–AN signals change when the ACTIVE signal is activated and a combination of the A0–AN signals activates a row during the active mode. In FIG. 3, the A0–AN signals represent the signals on address lines such as address lines 110 of FIG. 1. Thus, whenever the ACTIVE signal is activated, a row address represented by the A0–AN signals are automatically detected and stored into flip flops 305-0 to 305-N. By storing the address of the activated row during the active mode, the activated row can be distinguishable from a non-activated row during the refresh mode. Therefore, during the refresh mode, only memory cells of the activated row are refreshed. Memory cells of the non-activated row are omitted from refreshing.

Using the same example above with the memory device having 2048 rows of memory cells, to store up to 2048 combinations of the A0–AN signals, there are eleven address lines to provide eleven corresponding address signals to eleven corresponding storage elements (flip flops). Thus, in FIG. 3, N is 10. In the example, row address zero is represented by a combination of 00000000000 (eleven logic 0 bits), i.e., A0=0, A1=0 and all other address bits from A2 through A10 are all zeros. In terms of signal level, the signal level is LOW on each of the address lines 324-0 to 324-N (N=10). In a similar pattern, row address 1 is represented by 0000000001, i.e., A0=1, A1=0, and row address 2047 is represented by 11111111111.

As an example, if row 0 through row 511 are accessed during the active mode, the memory cells located from row 0 to row 511 are selected as the only memory cells that are refreshed during the refresh mode. When row 511 is accessed, combination of the A0–AN (N=10) signals representing row 511 is 00111111111, where A9 and A10 are zeros. In FIG. 3, the 00111111111 combination is stored in flip flop 305-0 to 305-N, in which flip flops 305 (N-1) and flip flop 305-N contain the zeros. Accordingly, except outputs Q of flip flops 305 (N-1) and 305-N, the signals on all outputs Q, are all HIGH.

To ensure that a lower row address does not replace the higher row address stored in the flip flops during an active mode, address override protection circuit 333 compares the A0–AN and the R0–RN signals. The A0–AN signals represent the address of the row being activated. The R0–RN signals represent the row address stored in the flip flops. The result of the comparison is provided to the flip flops in form of the AR0–ARN signals. If the address of the row being activated is less than the stored address, the stored address remains in the flip flops. In this case, the AR0–ARN signals are the same as the R0–RN signals are stored back to the flip flops. If the address of the row being activated is greater than the stored address, contents of the flip flops are replaced by the new address. In this case, the AR0–ARN signals are the same as the A0–AN and are stored into the flip flops as the new address.

For example, if a combination of the stored address is 00111111111 and the address of the row being activated is 001XXXXXXX0, where X can be either a logic 0 or a logic 1 bit, the address of the row being activated is less than the stored address. In this case, the stored address, i.e., 00111111111 remains in the flip flops. As another example, if the stored address is 00111111111 and the address of the row being activated is 01XXXXXXXXX, the address of the row being activated is greater than the stored address. In this case, the stored address is replaced by the new address, i.e., 01XXXXXXXXX.

To store the selected row addresses in the user programming method, the user enters the programming mode and inputs the selected row addresses. For example, the user enters the programming mode by activating a combination of signals such as the RAS*, CAS*, WE* and CS* signals shown in FIG. 1. Referring to FIG. 3, the flip flops are first reset by activating the RESET signal and forcing the A0–AN signals LOW so that all flip flops have logic 0 bits value and the signals R0–RN are all LOW. To select certain rows of memory cells for the refresh mode, the user applies an appropriate combination of signal levels to the A0–AN signals that represent the selected rows. For example, with a memory cells having 2048 rows, to select of row 0 to row 511 during a programming mode, A9 and A10 are forced LOW while A0 to A8 are forced HIGH. Thus, the combination of A0–A11 is 00111111111, where A9 and A10 are zeros. To enter different selected rows, for example, rows 0 to rows 32 the combination of A0 to A10 is 00000111111, or to enter row 0 to row 1023, the combination of A0–A10 is 0111111111. Following these patterns, other combinations can also be chosen to select row addresses.

During a refresh mode, after the flip flops 305-0 to 305-N of register 304 contain the bits representing the selected row addresses, compare circuit 306 compares the counted row address and the selected row address to determine which memory cells are refreshed. During the refresh mode, each of the compare units 318-0 to 318-N compares a signal on lines 312-0 to 312-N with a corresponding signal on lines 314-0 to 314-N. For example, in FIG. 3, compare unit 318-0 compares the signal on line 312-0 with the signal on line 314-0, compare unit 318-1 compares the signal on line 312-1 with the signal on line 314-1, and so on. The results from all compare units 318-0 to 318-N are provided to OR gate 330 as the signals on lines 320-0 to 320-N. Based on the signals on lines 320-0 to 320-N, OR gate 330 activates the SEL_EN signal accordingly. The operation of each of the compare units 318-0 to 318-N is described in connection with the operation of FIG. 4.

Referring to FIG. 4, when the RX signal is HIGH, it turns on transistor 414 and turns off transistors 412 and 422. When transistor 414 is on, it pulls the signal on line 320 to ground (LOW). When the RX signal is LOW, it turns off transistor 414 and turns on transistors 412 and 422. The signal on line 320, when the RX signal is LOW, depends on the signal level of the CX signal. Referring to FIG. 3, in the example with the memory device having 2048 rows and only the row 0 to row 511 are selected, the bits stored in the flip flops are 00111111111. Thus, the signal levels of the R(N-1) and RN are LOW (both are zeros) while the other signal levels of the R0–R(N-2) are HIGH.

In FIG. 3, when the R0–R(N-2) signals are HIGH, the signals on lines 320-0 to 320(N-2) are always pulled to ground (LOW). When counter 302 counts from zero up to 511, the R(N-1) and RN signals are always LOW and the C(N-1) and CN signals are always LOW. As a result, the LOW R(N-1) and RN signals cause pullup 402 to pull the signals on lines 320(N-1) and 320-N to the signal level of the C(N-1) and CN, which are LOW. In this case, the signals on other lines 320-0 to 320(N-2) are also LOW. Thus, when counter 302 counts from row zero to row 511, all signals on lines 320-0 to 320-N are LOW causing the SEL_EN signal LOW at the output of OR gate 330. The LOW SEL_EN signals causes a control logic such as control logic 116 (FIG. 1) to allow a refresh of the memory cells located at row 0 to row 511.

In the above example, when counter 302 counts past 511, i.e., 512 and up, either the C(N-1) or CN signal is HIGH. For example, at count 512, the combination of the C0–CN signals is represented by 01000000000, i.e., C(N-1) is 1 (HIGH). At count 1023 the combination is 10000000000, i.e., CN is 1 (HIGH). Therefore, when counter 302 counts passed 511, the signal on either line 312(N-1) or 312-N is HIGH. Since the R(N-1) and RN signals are always LOW, they pull either the signal on line 320(N-1) or 320-N HIGH (the signal levels of lines 312(N-1) or 312-N). When any of lines 320-0 to 320-N is HIGH (from count 512 and up), the SEL_EN signal at the output of OR gate 330 is HIGH causing the control logic to prevent a refresh of the memory cells located at row 512 and up.

In summary of the above example, register 304 stores row address zero to row address 511. During a refresh mode, when counter 302 counts from row address 0 to row address 511, compare circuit 306 makes the SEL_EN signal LOW to refresh all memory cells of row 0 to row 511 because the counted row address is within the selected row addresses. When counter 302 counts from row address 512 and up, compare circuits 306 makes the SEL_EN signal HIGH to prevent a refresh of memory of row 512 and up because the counted row address is not within the stored row addresses.

Figure 5:
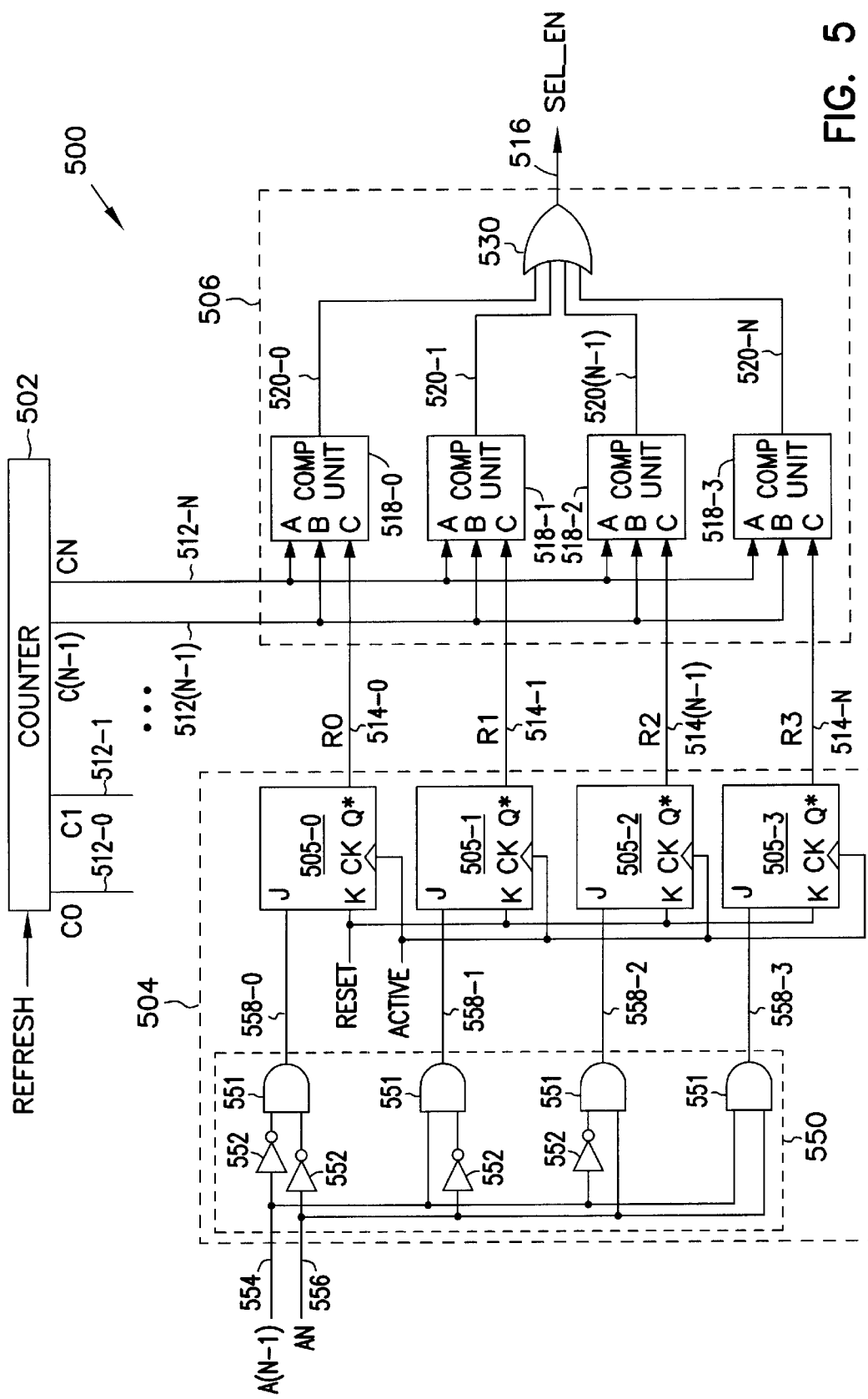
FIG. 5 is a schematic diagram of another refresh address selection circuit.

FIG. 5 is a schematic diagram of the refresh address selection circuit 500 according to another embodiment of the invention. Circuit 500 includes an address counter 502, a register 504, and a compare circuit 506. Elements 502, 504 and 506 are represented in FIG. 2 as counter 202, register 204 and compare circuit 206. In FIG. 5, counter 502 receives a refresh signal REFRESH and provides the output signals C0–CN on counter bit lines 512-0 to 512-N during a refresh mode. The REFRESH signal is similar to the REFRESH signal shown in FIG. 1 and FIG. 3. Each combination of the signals C0–CN represents an address of a row of memory cells. Register 504 includes a plurality of storage elements 505-0 to 505-3 connected to a plurality of register bit lines 514-0 to 514-3.

Similarly to the storage elements of FIG. 3, storage elements 505-0 to 505-3 are represented by JK flip flops 505-0 to 505-3. Each of the flip-flops 505-0 to 505-3 includes a first data input indicated by J, a second data input indicated by K, a clock input indicated by CK and an output indicated by Q*. In each of the flip-flops 505-0 to 505-3, output Q* is a complement of output Q. Each flip flop is capable of storing a bit of data.

Register 504 further includes a logic circuit 550. Logic circuit 550 includes a plurality of AND gates 551 and inverters 552. Logic circuit 500 further includes inputs connected to lines 554 and 556 and output connected to lines 558-0 to 558-3. Inputs at lines 554 and 556 receive address signals A(N-1) and AN. The A(N-1) and AN signals represent the most significant bits (highest order bits) of an address which is represented by a combination of the address signals such as the A0–AN signals on line 118 of FIG. 1. Logic circuit 550 operates to decode each combination of the A(N-1) and AN signals to provide a corresponding combination of logic output signals at outputs at lines 558-0 to 558-3.

In each of the flip flops 505-0 to 505-3, the first data input J connects to one of the outputs of logic circuit 550 at lines 558-0 to 558-3 to receive one of the logic output signals. The second data input K of each flip flop receives a reset signal RESET. Clock input CK of each flip flop receives a command signal ACTIVE. Output Q of each flip flop provides an output signal. For example, input J of flip flop 355-0 connects to line 558-0; input J of flip flop 505-1 connects to line 558-1. The ACTIVE signal in FIG. 5 is also shown as the ACTIVE signal generated by control logic 116 of FIG. 1.

Compare circuit 506 includes a plurality of compare units (COMP UNIT) 518-0 to 518-3. The number of compare units is the same as the number of storage elements. Thus, in the embodiment represented by FIG. 5, the number of compare units is four. However, in other embodiments, the number of compare units can be different than four. Each of the compare units includes first and second inputs A and B connected to two counter bit lines, a third input C connected to output Q* of one of the flip flops, and an output connected to one of the lines 520-0 to 520-3. The outputs of all compare units 518-0 to 518-3 connect to inputs of a combinatorial circuit 530. In the embodiment represented by FIG. 5, combinatorial circuit 530 is represented by an OR gate 530, which has an output connects to line 516 to provide a refresh select signal SEL_EN. In the embodiment represented by FIG. 5, the first and second inputs A and B of each of the compare units 518-0 to 518-3 connect to counter bit lines 512(N-1) and 512-N in which the combination of lines 512(N-1) and 512-N is a subset of lines 512-0 to 512-N. The signals provided by counter bit lines 512(N-1) and 512-N represent the most significant bits or the highest order bits of an address of a row of memory cells. In the embodiment represented by FIG. 5, counter bit lines C0–C(N-2) are not connected to compare circuit 506.

Figure 6:
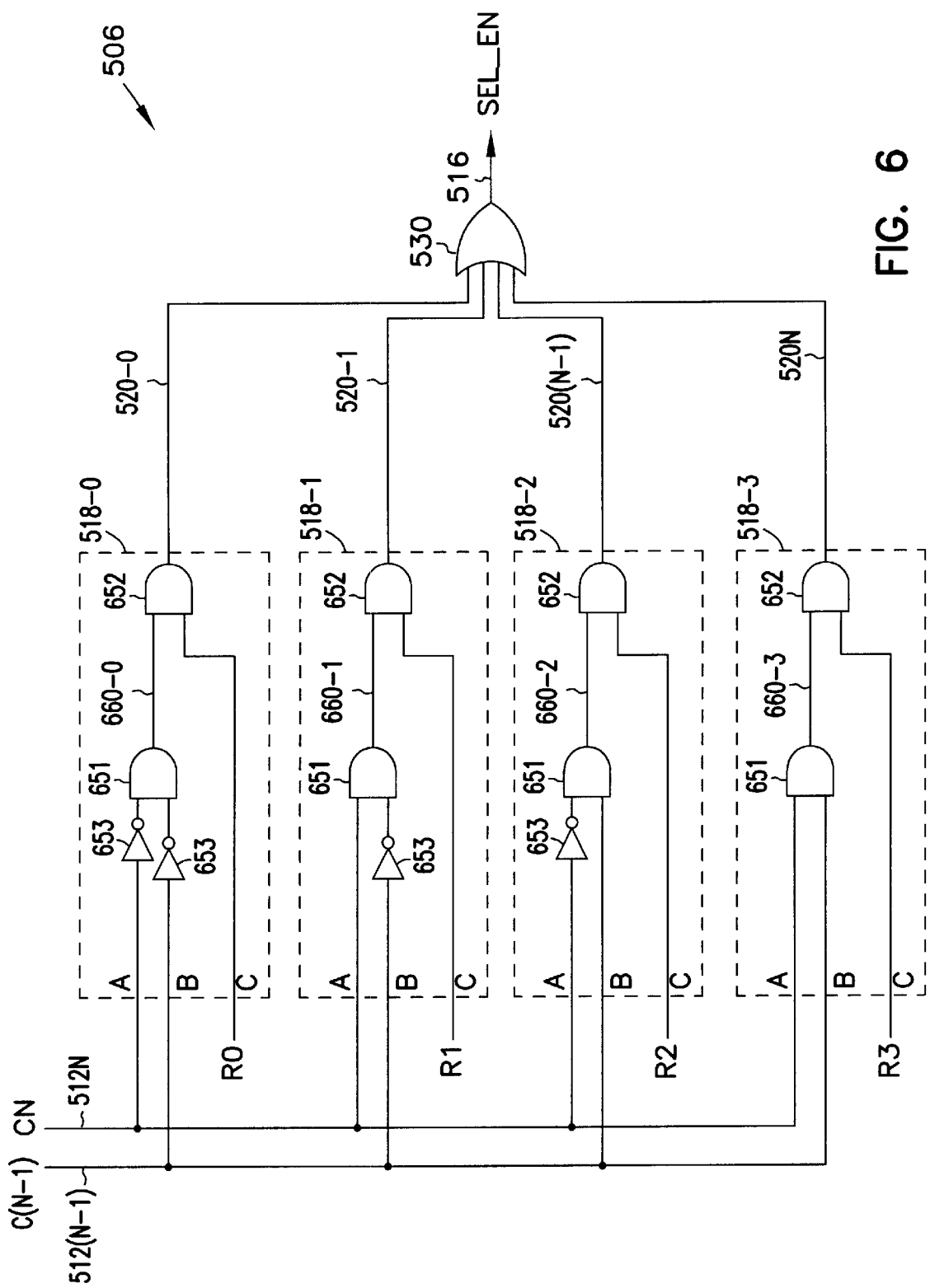
FIG. 6 is a schematic diagram of a compare circuit of FIG. 5.

FIG. 6 is a schematic diagram of compare circuit 506 of FIG. 5. In the embodiment represented by FIG. 6, each of the compare units 518-0 to 518-3 includes a plurality of logic gates and inverters indicated by AND gates 651 and 652 and inverters 653. AND gates 651 and inverters 653 connect to inputs A and B to operate as a decoder to decode different combination of the signals provided on lines 512(N-1) and 512-N, which are associated with the C(N-1) and the CN signals. The result decoded from inputs A and B is provided as a combination of signals on output lines 660-0 to 660-3. The signal on each of the lines 660-0 to 660-3 is combined with the signal on one of the R0–R3 signals on input C of a corresponding AND gate 652 to provide an output signal on one of the lines 520-0 to 520-3. The signals on lines 520-0 to 520-3 are provided to OR gate 530.

In FIG. 5, flip flops 505-0 to 505-3 store a number of ranges of row addresses. For example, using the memory device with 2048 rows, the 2048 rows can be divided into, for example, four ranges. FIG. 7 shows the four ranges, 0 to 3, and their associated row addresses. As shown in FIG. 7, a first range includes row 0 to row 511; a second range includes row 512 to row 1023; a third range includes row 1024 to row 1535; and the fourth range includes row 1536 to row 2047.

Each of the four ranges is assigned to one of four flip flops 505-0 to 505-3 of FIG. 5. For example, flip flop 505-0 is assigned to the first range, flip flop 505-1 is assigned to the second range, flip flop 505-2 is assigned to the third range, and flip flop 505-3 is assigned to the fourth range. In each flip flop, the state of one of the R0–R3 signals at output Q* indicates whether or not to refresh the rows located within the range assigned to that flip flop during the refresh mode. For example, the state of the R0 signal at flip flop 505-0 can be set such that when the R0 signal is LOW, memory cells of row 0 to row 511 are refreshed during the refresh mode, and that when the R0 signal is HIGH memory cells of row 0 to row 511 are not refreshed during the refresh mode.

The states of the R0–R3 signals depend on the values of the bits stored flip flops 505-0 to 505-3. The values of the bits stored in the flip flops are selected by either an automatic address detection method or a user program method. In the automatic address detection method, the value of the bits stored in flip flops 505-0 to 505-3 are reset such that the R0–R3 signals are all HIGH at all outputs Q* to indicate that none of the rows in the four ranges are refreshed during the refresh mode. After the reset, the value of the bit in a particular flip flop changes if a row within the range assigned to that particular flip flop is activated during the active mode. In the same example as shown in FIG. 7, if any one of row 0 to row 511 is activated during the active mode, the value the bit stored in flip flop 505-0 changes, i.e., from logic 0 bit to logic 1 bit, accordingly, the state of the R0 signal also changes, i.e., from HIGH to LOW. When the R0 signal is LOW, it indicates that row 0 to row 511 are refreshed during the refresh mode.

FIG. 8 shows combinations of bits that represent the row addresses from row 0 to row 2047 in the example shown in FIG. 7. As shown in FIG. 8, bits A0–A8 are represented by X's to indicate that the values of these bits can be either a logic 0 or a logic 1 depending on the address of a particular row. The difference between the ranges is based on the logic value of bits A10 and A9. For example, in range 0 (row 0 to row 511), both A10 and A9 are zeros; in range 1, A10 is zero and A9 is one; in range 3, A10 is 1 and A9 is zero; and in range 3, both A10 and A9 are zeros. In short, A10 and A9 are 00, 01, 10, and 11 in range 0, 1, 2, and 3 respectively. Therefore, in the active mode, the combination of bits A10 and A9, determines which range is activated.

In FIG. 5, logic circuit 500 decodes the combination of the A10 and A9 signals on lines 554 and 556 and outputs a result as a combination of signals on lines 558-0 to 558-3 such that the value of the bits stored in flip flop are changed according to the address of a row that is activated during the active mode. Using the example shown in FIG. 7, logic circuit 550 is connected as shown so that for each combination of the A10 and A9 signals, one of the values of the flip flop 505-0 to 505-3 changes. When the A10 and A9 signals are LOW (00) the signal on line 558-0 is HIGH causing the content of flip flop 550-0 to switch from LOW to HIGH. This causes the R0 signal to switch from HIGH to LOW (Q*=LOW). In a similar fashion, other combinations of the A10 and A9 signals, i.e., 01, 10, 11, also cause flip flops 550-1 to 550-3 to switch from HIGH to LOW. In summary, when the value of the bit in a particular flip flop changes, the corresponding signal level in one of the R0–R3 signals also changes to indicate that the rows of the range assigned to that particular flip flop are selected for a refresh mode.

The values of the bits in the flip flops 505-0 to 505-3 can also be selected by a user programming method. For example, the user enters the programming mode by activating a combination of signals such as the RAS*, CAS*, WE* and CS* signals shown in FIG. 1. In the programming mode, flip flops 505-0 to 505-N are first reset by activating the RESET signal and applying appropriate combinations of the A10 and A9 signals. Logic circuit 550 then causes the flip flops to reset the R0–R3 signals HIGH. To select a particular range during a refresh mode, the user applies appropriate combinations of the A10 and A9 signals so that the contents of the flip flops are changed to change the R0–R3 signals associated with the selected range from HIGH to LOW.

During a refresh operation, counter 502 sequentially counts address from row zero to the last row of the memory cells in response to the REFRESH signal. Compare circuit 506 compares a counted address represented by the C0–CN signals with the R0–R3 signals to determine whether or not to refresh the row of the counted address. Using the example shown in FIG. 7, counter 502 includes eleven counter bit lines, i.e., bits C0–C9, and C10 to represent count 0 to count 2047, where C9 and C10 are the two high order bits. Similarly to the combinations of bits that represent row 0 to row 2047 in FIG. 8, count 0 to count 2047 are represented by the same combination of bits shown in FIG. 8. Therefore the counts are divided into four ranges, in which the difference between the ranges can be identified by the two MSB, i.e., C10 and C9 (N=10). Thus, to compare the counted address with the address of the selected range, the combination of the signals represented by the C10 and C9 signals on lines 512-N and 512(N-1) are compared with the R0–R3 signals to determine which of addresses represented by count 0 to count 2048 is in the selected range.

For example, if row 0 to row 511 (range 0are selected, the R0 signal is LOW and the R1–R3 signals are HIGH. When counter 502 counts from zero to 511, the C10 and C9 signals are LOW (00). That means the signals on lines 512-N and 512(N-1), connected to inputs A and B, are both LOW. At compare unit 518-0 in FIG. 6, since R0 is LOW and is an input to AND gate 625 of compare unit 518-0, output 620-0 is always LOW. At other compare circuits 518-1 to 518-3, when the C10 and C9 signals are LOW, the signals on lines 660-1 to 660-3 are LOW, causing the signals on lines 520-1 to 520-3 also to go LOW. Thus, when the C10 and C9 signals are LOW (count 0 to count 511) the signals on lines 520-0 to 520-3 are LOW causing the signal SEL_EN the output of OR gate 556 LOW. A LOW SEL_EN signal enables the control logic to allow a refresh of row 0 to row 511.

In the above example, when counter 502 counts past 511, i.e., from count 512 to count 2047, either one or both of the C10 and C9 signals are HIGH (refer to FIG. 8). Thus, by the arrangement of compare units 518-0 to 518-3 of FIG. 6, one of the signals on lines 660-1 to 660-3 is HIGH causing one of the signals on line 520-1 to 520-3 HIGH, which makes the SEL_EN signal HIGH. A HIGH SEL_EN signal enables the control logic to prevent a refresh of row 512 to row 2047.

In the embodiment represented by FIG. 5, for simplicity and to concentrate in the invention, four storage elements 505-0 to 505-3 are shown to store up to four ranges of row addresses of a memory device having 2048 rows of memory cells. However, the number of storage elements can be different than four. For example, in other embodiments, the number of storage elements is eight and the 2048 rows is divided into eight different ranges with each range having fewer rows than the range when the number of storage elements is four.

In general, a relationship between the number of storage elements, compare units, and highest order counter bit lines connected to each compare unit is represented by the formula $M=\log_2 C$, where M is the number of storage elements, which represents the number of ranges of addresses of rows of memory cells, M is also the number of compare units. C is the number of highest order counter bit lines connected to each storage element such as lines 512 (N-1) and 512-N; C is also the number the most significant bits of an address represented by address signals, such as the A(N-1) and AN signals.

Figure 9:
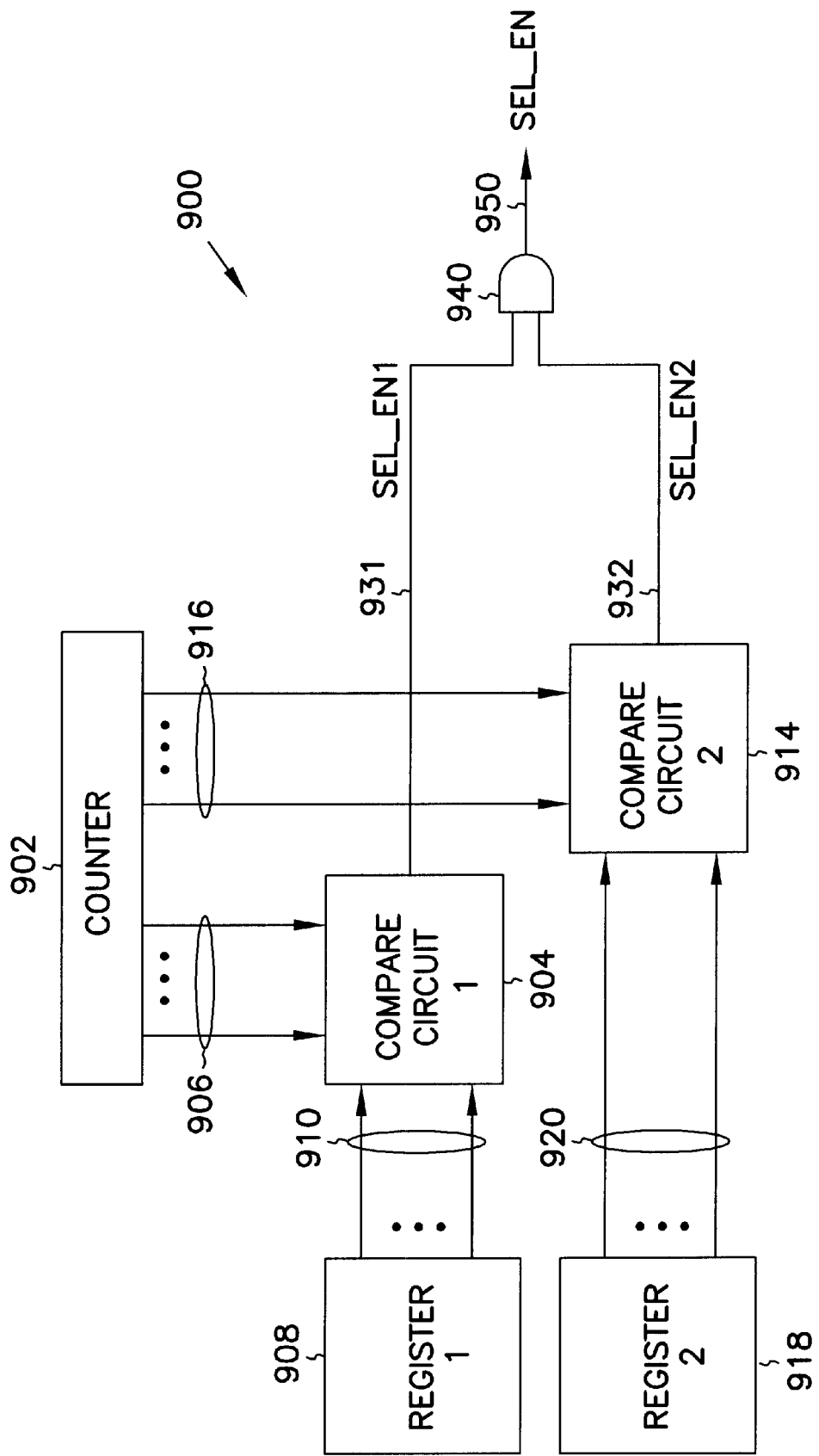
FIG. 9 is a block diagram of another refresh address selection circuit.

FIG. 9 is a block diagram of a refresh address selection circuit 900 according to another embodiment of the invention. Refresh address selection circuit 900 includes a combination of the refresh address selection circuits 300 (FIG. 3) and 500 (FIG. 5). In the embodiment of FIG. 9, refresh address selection circuit 900 includes a first compare circuit 904 connected to counter 902 via counter bits lines 906, and to a first register 908 via register output lines 910. A second compare circuit 914 connects to counter 902 via counter bit lines 916, and to a second register 918 via register output lines 920. Compare circuit 902 and register 908 are similar to compare circuit 302 and register 304 of FIG. 3. Compare circuit 914 and register 918 are similar to compare circuit 506 and register 504 of FIG. 5.

Refresh address selection circuit 900 further includes a combinatorial circuit 940. Combinatorial circuit is represented by an AND gate 940. The inputs of AND gate 940 connect to the outputs of compare circuits 904 and 914 via lines 931 and 932 to receive first and second select signals SEL_EN1 and SEL_EN2. AND gate 940 has an output at line 950 to provide a refresh select signal SEL_EN.

First compare circuit 904 and first register 908 are constructed and operate in a similar fashion as compare circuit 306 and register 304 of FIG. 3. Second compare circuit 914 and second register 918 are constructed and operate in a similar fashion as compare circuit 506 and register 504 of FIG. 5. In FIG. 9, however, the row addresses are divided into a first and a second group of addresses. First register 908 stores a first number of selected row addresses within the first group of addresses. Second register 918 stores a second number of selected row address within the second group of addresses. For example, with the memory having 2048 rows, the first group of addresses could include addresses of row 0 to row 1023, and second group of addresses could include addresses of row 1024 to 2047. Similarly to the embodiment represented by FIG. 5, the rows in the second group of addresses are divided into ranges and register 918 includes storage elements assigned to the number of ranges of the second address group.

In the embodiment represented by FIG. 9, lines 906 are lower order counter bit lines. The signals on line 906 represent row addresses of the first group of addresses. Lines 916 are high order counter bit lines. The signals on line 916 represent row addresses of the second group of addresses.

During a refresh mode, if an address counted by counter 902 is within the first selected row address, the SEL_EN1 signal is asserted LOW. The operation in this refresh mode operation is similar to the operation of refresh select circuit 300 described in connection with FIG. 3. If an address counted by counter 902 is within the second selected row address, the SEL_EN2 signal is asserted LOW. This is similar to the operation of refresh select circuit 500 described in FIG. 5. The SEL_EN1 and SEL_EN2 signals are HIGH if the counted address is not in neither the first nor the second selected row addresses.

When either the SEL_EN1 or SEL_EN2 signal is LOW, the SEL_EN signal is forced LOW. At AND gate 940, When both of the SEL_EN1 and SEL_EN2 signals are HIGH, the SEL_EN signal is forced HIGH. The SEL_EN signal is provided to a control logic such as control logic 116 (FIG. 1). Based on the state of the SEL_EN signal, the control logic either allows or prevents a refresh of the row at the address counted by counter 902 during the refresh mode. For example, the row is refreshed when the SEL_EN signal is LOW and is not refreshed when the SEL_EN signal is HIGH.

Figure 10:
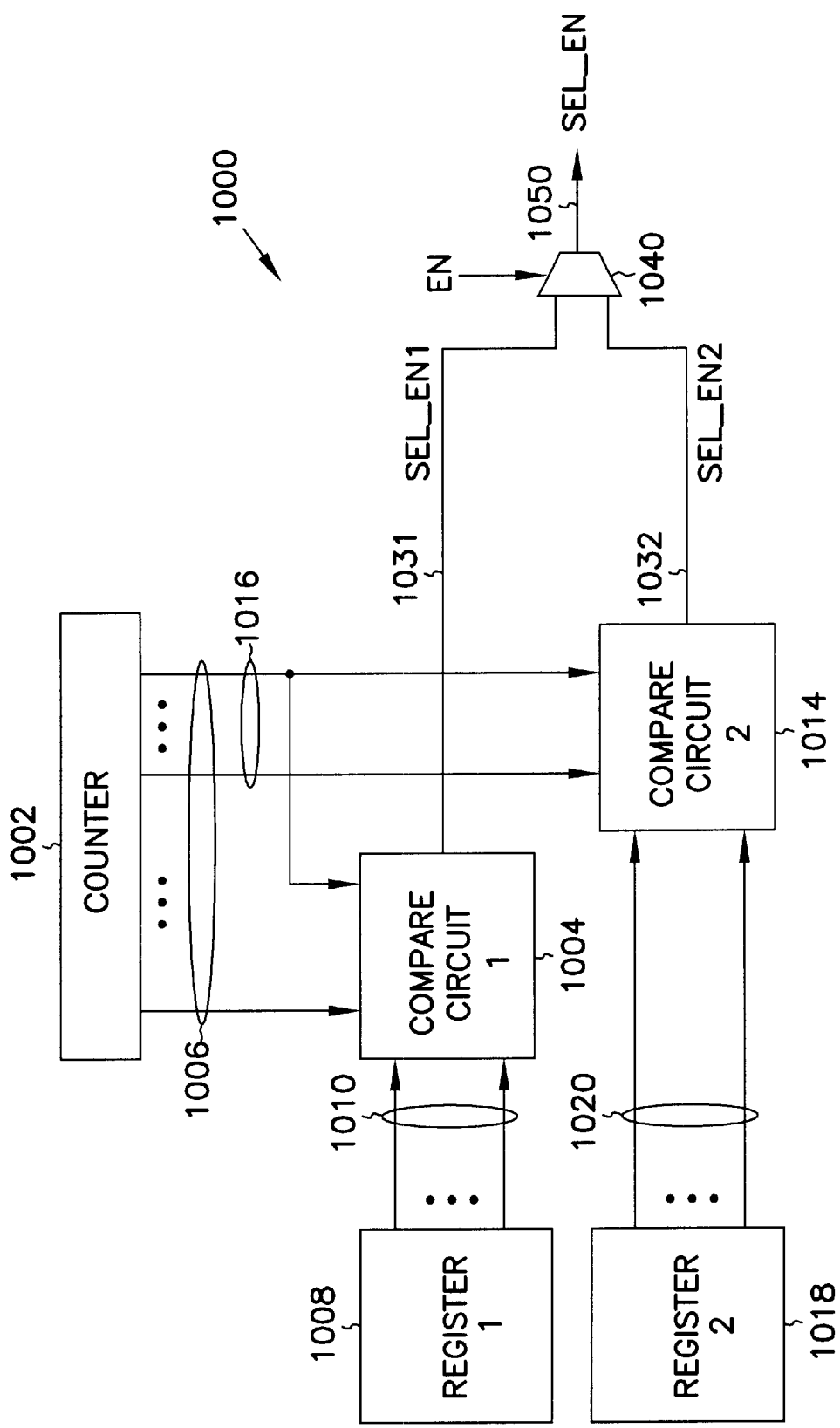
FIG. 10 is a block diagram of another refresh address selection circuit.

FIG. 10 is a block diagram of a refresh address selection circuit 1000 according to another embodiment of the invention. Refresh address selection circuit 1000 includes a combination of the refresh address selection circuits 300 (FIG. 3) and 500 (FIG. 5). A first compare circuit 1004 connects to counter 1002 via counter bits lines 1006 and to a first register 1008 via register output lines 1010. A second compare circuit 1014 connects to counter 1002 via counter bits lines 1016 and to a second register 1018 via register output lines 1020.

Refresh address selection circuit 1000 further includes a selector or multiplexer (MUX) 1040. The inputs of MUX 1040 connect to the outputs of compare circuits 1004 and 1014 via lines 1031 and 1032 to receive first and second select signals SEL_EN1 and SEL_EN2. MUX 1040 receives a control signal EN to pass either the SEL_EN1 or SEL_EN2 signal to an output at line 1050 as a refresh select signal SEL_EN. The EN signal is generated by control logic 116.

First compare circuit 1004 and first register 1008 are similar to compare circuit 306 and register 304 of FIG. 3. Second compare circuit 1014 and second register 1018 are similar to compare circuit 506 and register 504 of FIG. 5. For example, in FIG. 10, lines 1006, like lines 312-0 to 312N of FIG. 3, are the counter bit lines. Lines 1016 are subset of lines 1006 and are similar to line 512(N-1) and 512-N, which are subset of lines 512-0 to 512-N of FIG. 5.

Control signal EN at MUX 1040 is provided by a control logic such as control logic 116 shown in FIG. 1. When the EN signal at one signal level, e.g., LOW, MUX 1040 selects the SEL_EN1 signal to become the SEL_EN signal; the EN signal is also set by such that when it is at another signal level, e.g., HIGH, MUX 1040 selects the SEL_EN2 signal to become the SEL_EN signal.

During a refresh mode, refresh address selection circuit 1000 operates like refresh address selection circuit 300 of FIG. 3 or like refresh address selection circuit 500 of FIG. 5. For example, refresh address selection circuit 1000 operates in a fashion such as the operation of refresh address selection circuit 300 of FIG. 3 when the EN signal is set LOW. Refresh address selection circuit 1000 operates in a fashion such as the operation of refresh address selection circuit 500 of FIG. 5 when the EN signal is set HIGH. In either set up of the EN signal (LOW or HIGH), the SEL_EN signal serves the same purpose as the SEL_EN signal of FIG. 3 or FIG. 5. The SEL_EN signal is provided to a control logic such as control logic 116 (FIG. 1). Based on the state of the SEL-EN signal, the control logic either allow or prevent a refresh of the row at the address counted by counter 1002 during the refresh mode. For example, the row is refreshed when the SEL_EN signal is LOW and is not refreshed when the SEL_EN signal is HIGH.

Figure 11:
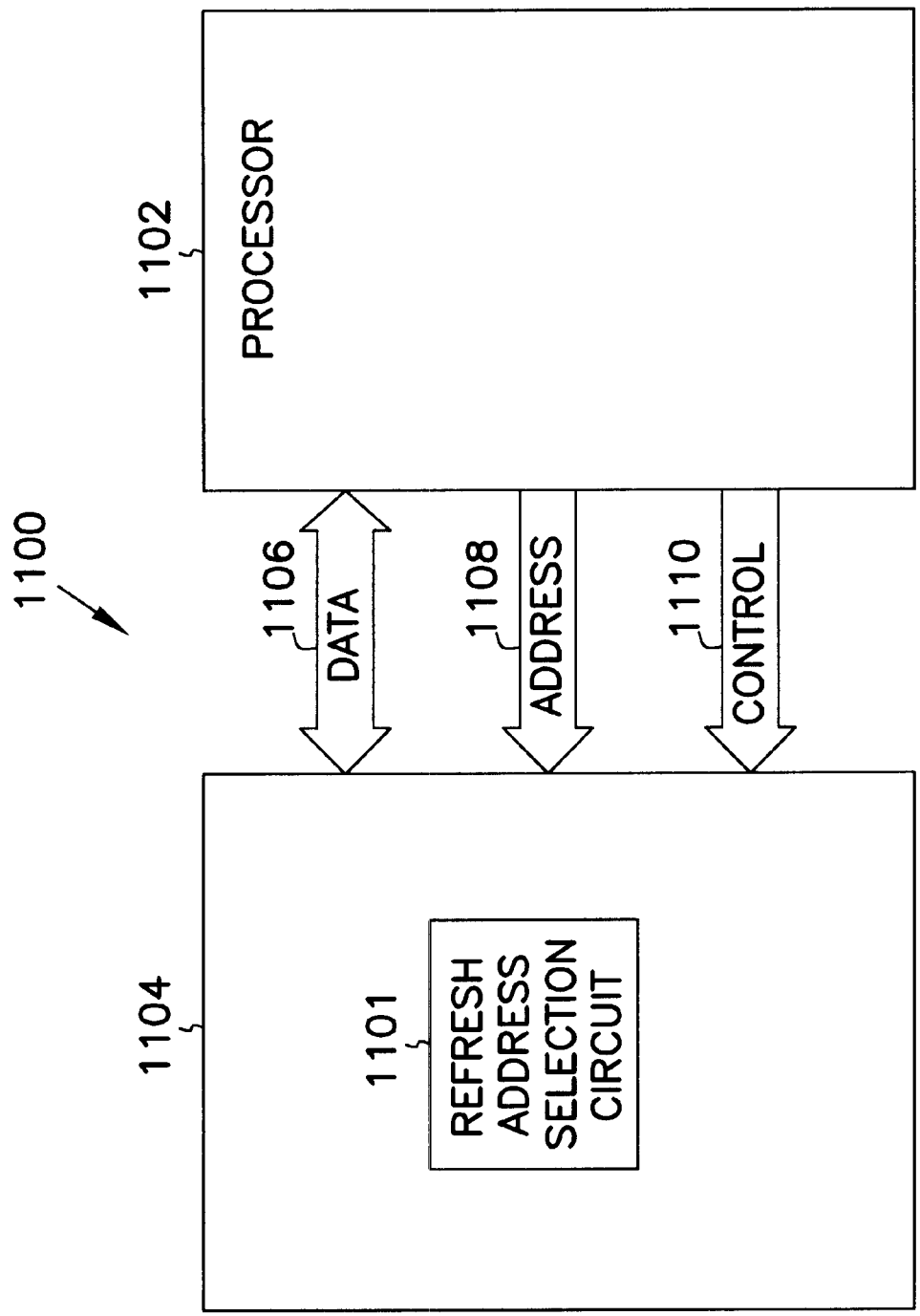
FIG. 11 is a block diagram of a system.

FIG. 11 shows a system 1100 according to one embodiment of the invention. System 1100 includes a processor 1102 and a memory device 1104. Memory device 1104 represents memory device 100 shown in FIG. 1. Processor 1102 can be a microprocessor, digital signal processor, embedded processor, microcontroller, or the like. Processor 1102 and memory device 1104 communicate using address signals on lines 1108, control signals on lines 1110, and data signals on lines 1106.

Memory device 1104 includes a refresh address selection circuit 1101. Refresh address selection circuit 1101 is similar to refresh address selection circuit 300, 500, 900 or 1000. In the embodiment represented by FIG. 11, processor provides control to memory 1104 via control signals on lines 1110. The control signals on lines 1110 similar to the control signals represented in FIG. 1 as the XCLK, CS*, RAS*, CAS*, and WE* signals. Based on the control signals, operating modes such as active mode and refresh mode of memory device 1104 are determined. According to the invention, during a refresh mode, refresh address selection circuit 1101 enables memory device 1104 to selectively refresh rows of memory cells that are selected by refresh address selection circuit 1101.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. A memory device comprising:

a counter to count addresses of rows of memory cells;

a register including a plurality of register cells for storing selected addresses of rows of memory cells; and a compare circuit including a plurality of compare units connected to the counter and the register to compare an address counted by the counter with the selected addresses such that a row of memory cells located at the address counted by the counter is refreshed if the address counted by the counter is within the selected addresses.

2. A memory device comprising:

a counter to count addresses of rows of memory cells;

a register to store selected addresses of rows of memory cells; and a compare circuit connected to the counter and the register to compare an address counted by the counter with the selected addresses such that a row of memory cells located at the address counted by the counter is refreshed if the address counted by the counter is within the selected addresses, wherein the memory device further comprises: a number of counter bit lines connected to the counter; a number of register bit lines connected to the register; and a number of compare units, wherein each of the compare units connects to one counter bit line and one register bit line.

3. The memory device of claim 2, wherein the number of counter bit lines equals the number of register bit lines.

4. A memory device comprising:
a counter to count addresses of rows of memory cells;
a register to store selected addresses of rows of memory cells; and
a compare circuit connected to the counter and the register to compare an address counted by the counter with the selected addresses such that a row of memory cells located at the address counted by the counter is refreshed if the address counted by the counter is within the selected addresses, wherein the memory device further comprises: a number of counter bit lines connected to the counter; a number of register bit lines connected to the register; and a number of compare units, and wherein each of the compare units connects one register bit line and a subset of counter bit lines.

5. A memory device comprising:
a counter to count addresses of rows of memory cells;
a register to store selected addresses of rows of memory cells; and
a compare circuit connected to the counter and the register to compare an address counted by the counter with the selected addresses such that a row of memory cells located at the address counted by the counter is refreshed if the address counted by the counter is within the selected addresses, wherein the register includes a number of storage elements to store a number of the data bits, wherein a combination of the data bits represents the selected addresses of rows of memory cells.

6. A memory device comprising:
a counter to count addresses of rows of memory cells;
a register to store selected addresses of rows of memory cells; and
a compare circuit connected to the counter and the register to compare an address counted by the counter with the selected addresses such that a row of memory cells located at the address counted by the counter is refreshed if the address counted by the counter is within the selected addresses, wherein the register includes a number of register cells to store a number of data bits, wherein one of the data bits represents the selected addresses of rows of memory cells.

7. A memory device comprising:
a counter including a plurality of counter bit lines to generate a plurality of count signals, each combination of the count signals representing a unique address of a row of memory cells;
a plurality of storage elements, configured to be programmed to form a combination of data bits that represents a plurality of rows of selected addresses of memory cells; and
a plurality of compare units, each of the compare units being connected to one counter bit line and to one of the storage elements for comparing an address generated by the counter with the selected addresses such that a row of memory cells located at the address generated by the counter is refreshed when the address generated by the counter is within the selected addresses.

8. The memory device of claim 7, wherein each of the storage elements includes:
a first data input to set the storage element to a first state in response to a reset signal;
a clock input to receive an active signal;
a second data input connected to an address line to set the storage element to a second state in response to the active signal; and
an output to provide an output signal identifying the state of the storage element.

9. The memory device of claim 7, wherein each of the compare units includes:
a pullup circuit connected to one of the storage elements and one of the counter bit lines;
a pull down circuit connected to the pullup circuit and ground; and
an output connected between the pullup and pulldown circuits to provide an output signal based on a state of the storage element.

10. The memory device of claim 9, wherein the memory device further comprises a combinatorial circuit connected to the output of each of the compare units to provide a refresh address select signal.

11. A memory device comprising:
a counter including a plurality of counter bit lines to generate a plurality of count signals, each combination of the count signals representing an address of a row of memory cells;
a plurality of storage elements to represents a plurality of ranges of addresses, each of the storage elements being configured to be programmed to represent a selected range of addresses; and
a plurality of compare units, each of the compare units being connected to a subset of the counter bit lines and one of the storage elements to compare an address generated by the counter with the range of addresses such that a row of memory cells located at the address generated by the counter is refreshed when the address generated by the counter is within the selected range of addresses.

12. The memory device of claim 11, wherein the memory device further comprises a logic circuit including a plurality of logic outputs to provide a plurality of logic output signals based on a combination of a plurality of address signals.

13. The memory device of claim 12, wherein each of the storage elements includes:
a first data input to set the storage element to a first state in response to a reset signal;
a clock input for receiving an active signal;
a second data input connected to one of the logic outputs for setting the storage element to a second state in response to a combination of the logic output signals; and
an output to provide an output signal identifying the state of the storage element.

14. The memory device of claim 13, wherein the memory device further comprises a combinatorial circuit connected to the output of each of the compare units to provide a refresh address select signal based on signal on the output of each of the compare units.

15. A memory device comprising:
a counter including a first and a second group of counter bit lines to generate a plurality of count signals, each combination of the count signals representing an address of a row of memory cells;
a first register to store selected addresses represented by the first group of counter bit lines;
a first compare circuit connected to the first register and the first group of the counter bit lines to compare an address counted by the counter with the selected addresses stored in the first register;
a second register to store selected addresses represented by the second group of counter bit lines;

a second compare circuit connected to the second register and the second group of the counter bit lines to compare the address counted by the counter with the selected addresses stored in the second register; and a combinatorial circuit connected to the first and second compare circuits to provide a refresh address select signal to refresh memory cells located at the address counted by the counter if the address counted by the counter matches the selected address stored in the first or the second register.

16. The memory device of claim 15, wherein the memory device further comprises:

a number of register bit lines connected to the first register; and a number of compare units, wherein each of the compare units connects to one register bit line and one counter bit line of the first group of the counter bit lines.

17. The memory device of claim 16, wherein the number of counter bit lines of the first group of the counter bit lines equals the number of register bit lines.

18. The memory device of claim 17, wherein the first register includes a number of storage elements to store a number of data bits, wherein a combination of the data bits represents the first selected addresses.

19. The memory device of claim 18, wherein the second register includes a plurality of storage elements, each of the storage elements being assigned to a range of addresses represented by the second group of counter bit lines.

20. A memory device comprising:

a counter including a plurality of counter bit lines to generate a plurality of count signals, each combination of the count signals representing a unique address of a row of memory cells;

a first register to store selected addresses of a row of memory cells;

a first compare connected to the first register and the counter bit lines to compare an address counted by the counter with the selected addresses stored in the first register;

a second register to store selected addresses of a row of memory cells;

a second compare circuit connected to the second register and a subset of counter bit lines to compare the address counted by the counter with the selected addresses stored in the second register; and a selector connected to the first and second compare circuits to provide a refresh address select signal based on a select signal to refresh memory cells located at the address counted by the counter if the address counted by the counter matches the selected address stored in the first or the second register.

21. The memory device of claim 20, wherein the subset of counter bit lines includes counter bit lines that provide high order bits of the address of a row of memory cells.

22. The memory device of claim 21, wherein the first register includes a number of storage elements to store a number of data bits, wherein a combination of the data bits represents the selected addresses of rows of memory cells.

23. The memory device of claim 20, wherein the second register includes a number of storage elements to store a number of data bits, wherein a combination of the data bits represents the selected addresses of rows of memory cells.

24. A memory device comprising:

a plurality of rows of memory cells;

a plurality of input to receive a plurality of input signals;

a control logic to generate a refresh command signal based on certain combinations of the input signals to initiate a refresh operation;

a counter to sequentially count addresses of the rows of memory cells in response to the refresh signal;

a register to store selected addresses of the rows of memory cells; and a compare circuit connected to the counter and the register to compare an addresses counted by the counter with the selected addresses such that a row of memory cells located at the address counted by the counter is refreshed when the address counted by the counter is within the selected addresses.

25. The memory device of claim 24, wherein the refresh operation is a self-refresh operation.

26. The memory device of claim 24, wherein the refresh operation is an auto-refresh operation.

27. The memory device of claim 25, wherein the memory device further comprises:

a number of counter bit lines connected to the counter;

a number of register bit lines connected to the register; and a number of compare units, wherein each of the compare units connects to one counter bit line and one register bit line.

28. The memory device of claim 24, wherein the memory device further comprises:

a number of counter bit lines connected to the counter;

a number of register bit lines connected to the register; and a number of compare units, wherein each of the compare units connects to one register bit line and a subset of counter bit lines.

29. The memory device of claim 27, wherein the number of counter bit lines equals the number of register bit lines.

30. The memory device of claim 24, wherein the register includes a number of storage elements to store a number of the data bits, wherein a combination of the data bits represents the selected addresses of rows of memory cells.

31. The memory device of claim 24, wherein the register includes a number of register cells to store a number of data bits, wherein one of the data bits represents selected range of addresses of the rows of memory cells.

32. A system comprising:

a processor; and a memory device connected to the processor, the memory device comprising:

a counter to count addresses of rows of memory cells;

a register including a plurality of register cells for storing selected addresses of rows of memory cells; and a compare circuit including a plurality of compare units connected to the counter and the register to compare an address counted by the counter with the selected addresses such that a row of memory cells located at the address counted by the counter is refreshed when the address counted by the counter is within the selected addresses.

33. A system comprising:

a processor and a memory device connected to the processor, the memory device comprising:

a counter to count addresses of rows of memory cells;

a register to store selected addresses of rows of memory cells; and a compare circuit connected to the counter and the register to compare an address counted by the counter with the selected addresses such that a row of memory cells located at the address counted by the counter is refreshed when the address counted by the counter is within the selected addresses, wherein the memory device further comprises: a number of counter bit lines connected to the counter; a number of number of register bit lines connected to the register; and a number of compare units, wherein each of the compare units connects to one counter bit line and one register bit line.

34. The system of claim 33, wherein the number of counter bit lines equals the number of register bit lines.

35. A system comprising:
a processor; and
a memory device connected to the processor, the memory device comprising:
  a counter to count addresses of rows of memory cells;
  a register to store selected addresses of rows of memory cells; and
  a compare circuit connected to the counter and the register to compare an address counted by the counter with the selected addresses such that a row of memory cells located at the address counted by the counter is refreshed when the address counted by the counter is within the selected addresses, wherein the memory device further comprises: a number of counter bit lines connected to the counter; a number of register bit lines connected to the register; and a number of compare units, wherein each of the compare units connects one register bit line and a subset of counter bit lines.

36. A system comprising:
a processor; and
a memory device connected to the processor, the memory device comprising:
  a counter including a first and a second group of counter bit lines to generate a plurality of count signals, each combination of the count signals representing an address of a row of memory cells;
  a first register to store selected addresses represented by the first group of counter bit lines;
  a first compare circuit connected to the first register and the first group of the counter bit lines to compare an address counted by the counter with the selected addresses stored in the first register;
  a second register to store selected addresses represented by the second group of counter bit lines;
  a second compare circuit connected to the second register and the second group of the counter bit lines to compare the address counted by the counter with the selected addresses stored in the second register; and
  a combinatorial circuit connected to the first and second compare circuits to provide a refresh address select signal to refresh memory cells located at the address counted by the counter if the address counted by the counter matches the selected address stored in the first or the second register.

37. The system of claim 36, wherein the memory device further comprises:
  a number of register bit lines connected to the first register; and
  a number of compare units, wherein each of the compare units connects to one register bit line and one counter bit line of the first group of the counter bit lines.

38. The system of claim 36, wherein the number of counter bit lines of the first group of the counter bit lines equals the number of register bit lines.

39. The system of claim 36, wherein the first register includes a number of storage elements to store a number of data bits, wherein a combination of the data bits represents the first selected addresses.

40. The system of claim 36, wherein the second register includes a plurality of storage elements, each of the storage elements being assigned to a range of addresses represented by the second group of counter bit lines.

41. A system comprising:
a processor; and
a memory device connected to the processor, the memory device comprising:
  a plurality of rows of memory cells;
  a plurality of input to receives a plurality of input signals;
  a control logic to generate a refresh command signal based on certain combination of the input signals to initiate a refresh operation;
  a counter to sequentially count addresses of the rows of memory cells in response to the refresh signal;
  a register to store selected addresses of the rows of memory cells; and
  a compare circuit connected to the counter and the register to compare an addresses counted by the counter with the selected addresses such that a row of memory cells located at the address counted by the counter is refreshed when the address counted by the counter is within the selected addresses.

42. The system of claim 41, wherein the memory device further comprises:
  a number of counter bit lines connected to the counter;
  a number of register bit lines connected to the register; and
  a number of compare units, wherein each of the compare units connects to one counter bit line and one register bit line.

43. The system of claim 41, wherein the memory device further comprises:
  a number of counter bit lines connected to the counter;
  a number of register bit lines connected to the register; and
  a number of compare units, wherein each of the compare units connects to one register bit line and a subset of counter bit lines.

44. A method of refreshing memory cells of a memory device, the method comprising:
  generating a count that represents an address of a row of the memory cells;
  comparing a bit of the address represented by the count with a bit of a selected address; and
  refreshing memory cells of a row located at the address counted by the count when the address represented by the count matches the selected address.

45. A method of refreshing memory cells of a memory device, the method comprising:
  generating a count that represents an address of a row of the memory cells;
  comparing the address represented by the count with a selected address; and
  refreshing memory cells of a row located at the address counted by the count when the address represented by the count matches the selected address, wherein comparing includes comparing each bit of the count with a corresponding bit of a register that stores the selected address.

46. A method of refreshing memory cells of a memory device, the method comprising:

generating a count that represents an address of a row of the memory cells;

comparing the address represented by the count with a selected address; and refreshing memory cells of a row located at the address counted by the count when the address represented by the count matches the selected address, wherein comparing includes comparing selected bits of the count with all bits of a register, wherein each bit of the register represents a range of addresses.

47. A method of refreshing memory cells of a memory device, the method comprising:

storing a plurality of stored data bits that presents selected addresses of rows of the memory cells;

generating a plurality of counts, the counts representing addresses of a plurality of rows of memory cells;

comparing each of the counts with the stored data bits; and refreshing memory cells of a row located at an address represented by one of the count when the address represented by one of the count matches the selected addresses.

48. The method of claim 47, wherein storing is performed during a programming mode.

49. The method of claim 47, wherein storing is performed during an active mode when a row of memory cells is activated.

* * * * *

UNITED STATES PATENT AND TRADEMARK OFFICE
CERTIFICATE OF CORRECTION

PATENT NO. : 6,650,587 B2
DATED : November 18, 2003
INVENTOR(S) : Casey R. Kurth, Scott J. Derner and Daryl L. Habersetzer It is certified that error appears in the above-identified patent and that said Letters Patent is hereby corrected as shown below:

Title page,
Item [74], *Attorney, Agent or Firm*, delete "Woesner" and insert -- Woessner -- therefor.

Column 1,
Line 9, delete "KACKGROUND" and insert -- BACKGROUND -- therefor.

Column 7,
Line 37, delete "bits" and insert -- bit -- therefor.
Line 45, delete "A11" and insert -- A10 -- therefor.

Column 10,
Line 38, insert -- of -- after "value".

Column 11,
Line 42, delete "0are" and insert -- 0) are -- therefor.

Column 12,
Line 17, insert -- of -- after "number".

Column 13,
Line 7, delete "not in" before "neither".
Line 7, insert -- in -- after "neither".
Line 7, insert -- in -- after "nor".
Line 10, delete "When" and insert -- when -- therefor.
Line 44, delete "312N" and insert -- 312-N -- therefor.

Column 16,
Line 22, delete "represents" and insert -- represent -- therefor.

Column 18,
Line 62, insert -- ; -- after "processor".

Column 19,
Line 9, delete second instance of "number of" before "register".

UNITED STATES PATENT AND TRADEMARK OFFICE
CERTIFICATE OF CORRECTION

PATENT NO. : 6,650,587 B2
DATED : November 18, 2003
INVENTOR(S) : Casey R. Kurth, Scott J. Derner and Daryl L. Habersetzer It is certified that error appears in the above-identified patent and that said Letters Patent is hereby corrected as shown below:

Column 20,
Line 17, delete "receives" and insert -- receive --.
Line 27, delete "an" after "compare".

Signed and Sealed this

Fifteenth Day of June, 2004

JON W. DUDAS
*Acting Director of the United States Patent and Trademark Office*